United States Patent
Specks et al.

(12)

(10) Patent No.: US 6,350,954 B1
(45) Date of Patent: Feb. 26, 2002

(54) ELECTRONIC DEVICE PACKAGE, AND METHOD

(75) Inventors: Will Specks, Munich; Nils Bossemeyer, Hersbruck; Mervi Paulasto, Munich, all of (DE)

(73) Assignee: Motorola Inc., Schaumburg, IL (US)

( * ) Notice: Subject to any disclaimer, the term of this patent is extended or adjusted under 35 U.S.C. 154(b) by 0 days.

(21) Appl. No.: 09/489,726

(22) Filed: Jan. 24, 2000

(51) Int. Cl.[7] .................. H01L 23/02; H01L 23/48; H05K 1/16
(52) U.S. Cl. ............. 174/52.4; 257/778; 257/734; 174/260; 174/255
(58) Field of Search ................ 174/52.2, 52.3, 174/52.4, 255, 260, 261, 262, 263, 266; 257/690, 778, 734, 735, 752, 773; 361/760, 761, 762, 764

(56) References Cited

U.S. PATENT DOCUMENTS

| 3,908,185 A | * | 9/1975 | Martin | 357/74 |
|---|---|---|---|---|
| 4,866,571 A | * | 9/1989 | Butt | 361/386 |
| 5,057,376 A | * | 10/1991 | Sunhara et al. | 428/432 |
| 5,404,273 A | | 4/1995 | Akagawa | 361/707 |
| 5,689,091 A | * | 11/1997 | Hamzehdoost et al. | 174/255 |
| 5,801,446 A | * | 9/1998 | DiStefano et al. | 257/778 |
| 5,847,936 A | * | 12/1998 | Forehand et al. | 361/794 |
| 5,936,305 A | | 8/1999 | Akram | 257/723 |
| 6,011,692 A | * | 1/2000 | Bergstedt et al. | 361/707 |

FOREIGN PATENT DOCUMENTS

| GB | 2334143 | | 8/1999 | H01L/21/60 |
|---|---|---|---|---|
| JP | 59165439 | * | 9/1984 | 257/693 |
| JP | 6341052 | * | 2/1988 | 257/784 |

OTHER PUBLICATIONS

WSI Wafer Scale Integration; Slides from the lecture "Aufbau und Verbindungstechnik" (construction and connecting technology) by Prof. Dr.–Ing. Hösel; Hochschule Mittweida; Mittweida, Germany; 1998; and disclaimer.

* cited by examiner

Primary Examiner—Dean A. Reichard
Assistant Examiner—Carmelo Oliva

(57) ABSTRACT

An electronic package (100) has a semiconductor device (130), a two-layer (110, 120) printed circuit substrate (101), and a lead (140) for providing external connections for the package assembly (100). The first layer (110) has an electrical conducting surface structure (112); and the second layer (120) has a recess (125) to receive the device (130). The device frontside (131) is electrically coupled to the conducting surface structure (112) of the first layer (110) in a flip-chip arrangement. The backside (132) of the device (130) is coplanar to the surface (112) of the second layer (120). The lead (140) at least partially overlays the surface (122) of the second layer (120).

12 Claims, 1 Drawing Sheet

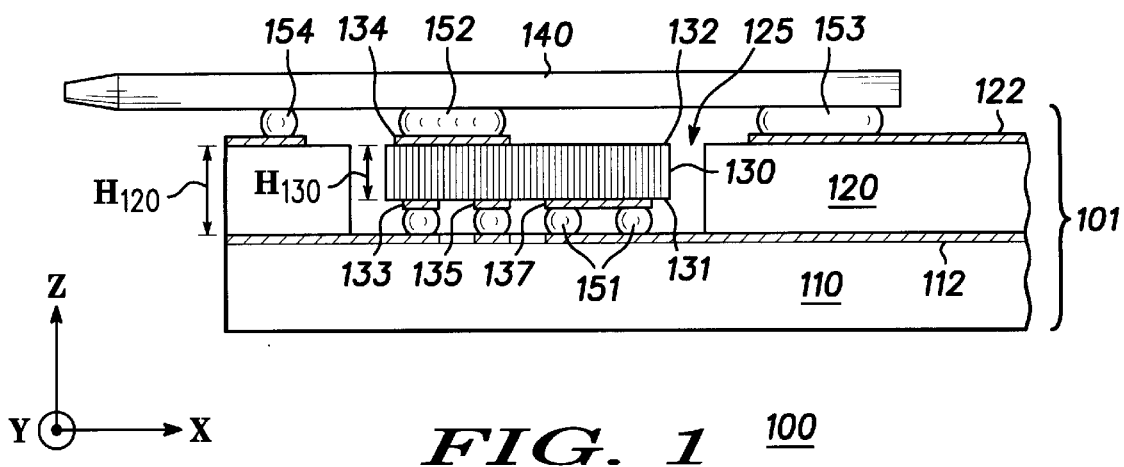
FIG. 1 100
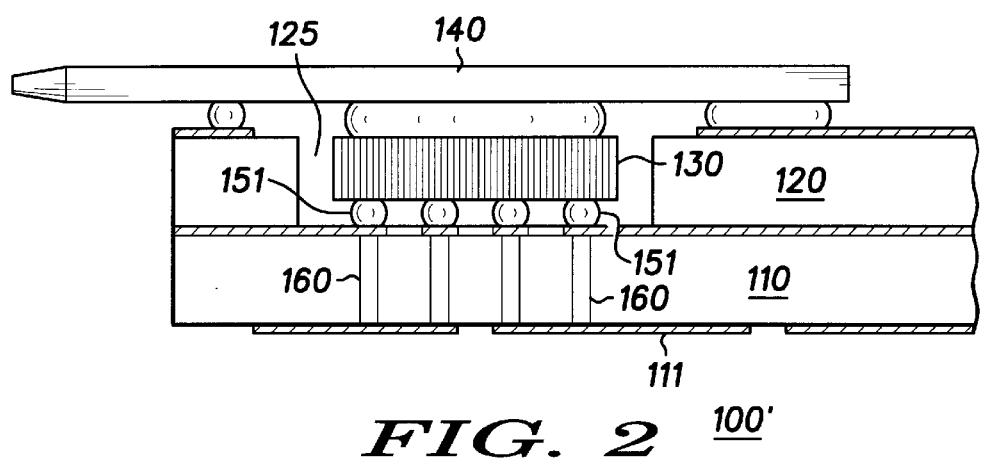
FIG. 2 100'
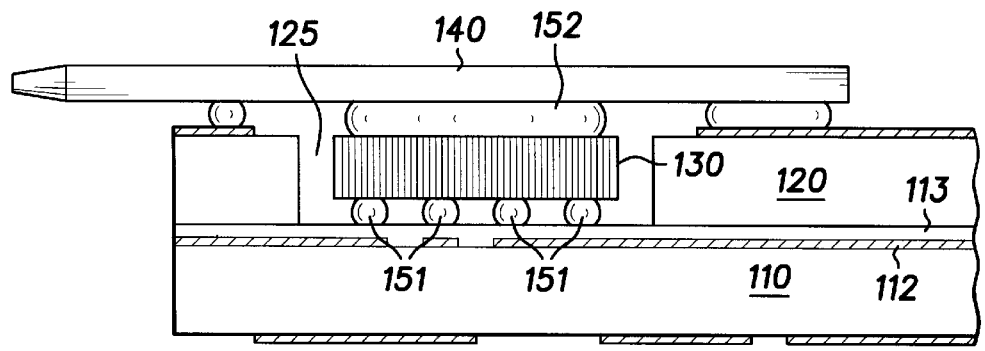
FIG. 3 100"

ELECTRONIC DEVICE PACKAGE, AND METHOD

FIELD OF THE INVENTION

The present invention generally relates to electronic device packages, and more particularly, but not exclusively, to electronic device packages using metal leadframes.

BACKGROUND OF THE INVENTION

In the electronics industry, discrete transistors, integrated circuits, as well as passive elements have to be arranged on a printed circuit board. Miniaturization is thereby of vital importance for many applications (e.g., mechatronics)

The need for an electronic device package assembly, is illustrated by the example of automotive applications where power and logic devices are used in conjunction with each other, to perform a single function. For example, an electric motor for operating an automatic sunroof or a window of a vehicle is typically actuated by a switch formed by power transistors. In order to reduce power consumption, the switch is ideally placed as close as possible to the electric motor, thus keeping the length of high current paths to a minimum and hence reducing unnecessary power losses. Typically the driver of a vehicle may prefer to operate a separate input key on the dashboard of the vehicle, which then sends a (low-power) signal to the switch, in order to actuate it. Therefore a certain amount of logic circuitry is required, preferably at the switch, in order to control the actuation and other auxiliary functions, such as fail-safe features. Therefore there is a need to incorporate logic integrated circuits and power transistors into a single package, which is ideally adapted to be mounted on or in close proximity to the electric motor.

A problem with existing combined logic/power packages is that the high power requirements of the switch do not easily facilitate integration with low power logic integrated circuits. The high currents involved preclude the use of conventional wire bond techniques, and the thermal management of heat dissipation presents further problems.

Various techniques are known for mounting and arranging semiconductor devices in packages. The British patent application GB 2 334 143 A ("Reference 1") describes an electronic device package having a semiconductor device sandwiched between a metal leadframe and a substrate. Electrical connections can be provided at both faces of the device. Further useful references are U.S. Pat. 5,936,305 to Akram et al. ("Reference 2"); and U.S. Pat. 5,404,273 to Akagawa ("Reference 3").

The present invention seeks to provide an improved electronic device package which mitigates or avoids disadvantages and limitations of the prior art.

BRIEF DESCRIPTION OF THE DRAWINGS

FIG. 1 illustrates a simplified side-view of an electronic device package in a first embodiment of the present invention having a device inserted into a multilayer printed circuit substrate;

FIG. 2 illustrates a simplified side-view of an electronic device package of FIG. 1 in a second embodiment further comprising via-defined flip-chip bumps; and FIG. 3 illustrates a simplified side-view of the electronic device package of FIG. 1 in a third embodiment further comprising a solder-stop mask.

DETAILED DESCRIPTION OF A PREFERRED EMBODIMENT

FIG. 1 illustrates a simplified side-view of an electronic device package 100 in a first embodiment of the present invention. Package 100 comprises device 130 mounted on multilayer printed circuit substrate 101 and lead 140. When package 100 is used as a logic/power package (discussed above), then package 100 further comprises logic circuits (not illustrated) located, for example, on either side of substrate 101.

For convenience, FIG. 1 also illustrates rectangular coordinate system XYZ with, in the example, the X-axis going to the right, the Y-axis going into the page, and the Z-axis going upwards. As illustrated in the following, layer surface structures 112, 122 and device sides 131, 132 each are located in substantially parallel planes (substantially equal Z-coordinates).

Device 130 has first side 131 (in FIG. 1 conveniently illustrated at the bottom) and second side 132 (illustrated at the top). Device 130 can be any semiconductor die being, for example, an integrated circuit, a power transistor (e.g., FET), or a passive element (e.g., a coil). Device 130 has at least one electrode 133 on side 131 and at least one electrode 134 on side 132 (cf. reference 1). For convenience, FIG. 1 also illustrates optional electrodes 135 and 137 on side 131.

When device 130 is a power transistor, the main transistor current flows from side 131 (e.g., being a drain electrode) to side 132 (e.g., being a source electrode), or vice versa.

Considering the production of device 130 before its implementation into substrate 101, for example, by integrating circuitry on the frontside of a semiconductor wafer, the sides of device 130 are conveniently referred to as frontside 131 and backside 132.

Printed circuit substrate 101 has first layer 110 (illustrated as bottom layer) and second layer 120 (illustrated as top layer). Both layers 110 and 120 are isolating (dielectric layers) and made from organic material (e.g., epoxy) or anorganic material (e.g., ceramic).

According to the present invention, layer 120 has recess 125 (opening) to receive device 130. The thickness $H_{130}$ (or "height", measured in parallel to the Z-axis) of device 130 is dimensioned such that side 132 of device 130 is substantially coplanar (i.e. same Z-coordinate) to surface structure 122 of layer 120.

Layer 110 has at least one electrical conducting surface structure (e.g., metal tracks) with a pattern that corresponds to electrode 133 at side 131 of device 130. FIG. 1 illustrates conducting surface structure 112 (bold line in the figure) as located between layers 110 and 120 (top of 110). This is convenient, but not essential for the present invention (alternative, cf. FIG. 2).

Side 131 of device 130 is, at least partially, electrically coupled to surface structure 112 of layer 110, preferably, by solder joints 151. As illustrated in FIG. 1, structure 112 has portions each being coupled to electrode 133, 135 and 137.

Persons of skill in the art can provide these joints without the need of further explanation, for example, by metal-bearing bumps, especially by solder bumps. In other words, device 130 is attached to layer 110 in a flip-chip arrangement.

Lead 140 provides external connections for package 100 by being electrically coupled to side 132 of device 130, preferably, by solder joints 152 similar to that explained above. Lead 140 overlays surface structure 122 of layer 120 at least partially. As illustrated in FIG. 1, lead 140 can be further coupled to surface structure 122 of layer 120 through further joints 153–154. Preferably, lead 140 is made of massive metal material or made of metallized dielectric material. Preferably, lead 140 is part of a leadframe with further leads (not illustrated).

Persons of skill in the are can optionally add further layers with or without conducting surface structures. Preferably, dielectric filing material (not illustrated) is provided around joints 151–152 to fill cavity areas between device 130 and surface 112 of layer 110 (in recess 125) and lead 140 (cf. reference 1).

Without the need of further explanation herein, persons of skill in the art can dimension the vertical extensions (along Z-axis) of joints 151, 152, 153, the thickness $H_{130}$ (of device 130) and $H_{120}$ (of layer 120) such that lead 140 becomes coplanar to surface structure 122 throughout the X-extension of lead 140. This is an important advantage of the present invention over the prior art.

Having device 130 embedded into layers 110 and 120 according to the present invention allows a substantially planar lead (i.e. flat lead). The present invention offers the further benefit of full routing freedom for connections optionally applied to the lower surface of layer 110.

Preferably, the thickness of surface structure 112 is chosen such that structure 112 also serves to thermally conduct heat from device 130.

FIG. 2 illustrates a simplified side-view of electronic device package 100 of FIG. 1 in a second embodiment comprising via-defined flip-chip bumps 160. Package 100' (FIG. 2) comprises layers 110 and 120 (with recess 125), device 130, lead 140, and joints 151, 152 similar as package 100 (FIG. 1) Electrical conducting surface structure 111 to be coupled to device 130 is located at layer 110 at the surface which is opposite to layer 120 (illustrated at the bottom). Side 131 of device 130 is electrically coupled to surface structure 111 by solder joints 151 (cf. FIG. 1, between layer 110 and device 130) and by corresponding electrical conductive vias 160 through layer 110 (preferably, in Z-direction; one via for one bump).

In other words, first and second embodiments of the present invention distinguish by the location of the electrical conducting surface, either at the top (112, FIG. 1) or at the bottom (111, FIG. 2) of bottom layer 110. However, a person of skill in the art can combine both embodiments without the need of further detailed explanation herein. For example, layer 110 can have two (or more) conducting structures 112 and 111.

Shortly, the present invention provides a packaged semiconductor die 130 being inserted in multilayer substrate 101 with upper layer 120 and lower layer 110, wherein first die surface structure 131 is electrically connected to conducting structure 111/112 (top or bottom) at lower layer 110, second die surface 132 is coplanar to surface 122 of substrate 101 and is electrically connected to substrate 101 by planar metal leadframe 140.

FIG. 3 illustrates a simplified side-view of electronic device package 100 of FIG. 1 in a third embodiment further comprising solder-stop mask 113. Package 100" (FIG. 3) comprises layers 110 and 120 (with recess 125), device 130, lead 140, and joints 151, 152 similar as package 100 of FIG. 1 or package 100' of FIG. 2. Additionally, solder-stop mask 113 covers structure 112 and provides a defined solder interconnect area. Mask 113 is provided either (a) only within recess 125 or (b) covering surface 112 completely. Preferably, mask 113 is made of a dielectric foil or by an optical photo resist. A convenient polyimide-based foil is traded as "Kapton" by Goodfellow Corporation, 800 Lancaster Avenue, Berwyn, PA. 19312-1780, United States.

Persons of skill in the art are able to manufacture the embodiments of the present invention by known technology steps without the need of further detailed explanation herein.

In short, the present invention can be described by a method for packaging semiconductor device 130 (having sides 131 and 132) into substrate 101. The method comprises the following steps:

providing printed circuit substrate 101 having layers 110 and 120, wherein layer 110 has electrical conducting surface structure 112/111 and layer 120 has recess 125;

providing lead 140 for externally connecting device 130;

inserting device 130 into recess 125 to electrically couple side 131 of device 130 to electrical conducting surface structure 121/111 of layer 110 and to arrange side 132 of device 130 coplanar to the surface of layer 120; and electrically coupling side 132 of device 130 to lead 140 which at least partially overlays the surface of layer 120.

While the invention has been described in terms of particular structures, devices and methods, those of skill in the art will understand based on the description herein that it is not limited merely to such examples and that the full scope of the invention is properly determined by the claims that follow.

What is claimed is:

1. An electronic package, comprising:
   a semiconductor device having a first side and a second side;
   a printed circuit substrate having a first layer and a second layer, said first layer with an electrical conducting surface structure, wherein said second layer has a recess to receive said semiconductor device so that
      (i) said first side of said device is electrically coupled in a flip-chip configuration to said electrical conducting surface structure of said first layer and
      (ii) said second side of said device is coplanar to a surface of said second layer; and
   a lead for providing external connections for said package by being electrically coupled to said second side of said device and at least partially overlaying said surface of said second layer and at least partially overlying said second side of said device.

2. The package of claim 1 wherein said electrical conducting surface structure is located between said first layer and said second layer.

3. The package of claim 2 wherein said first side of said device is electrically coupled to said electrical conducting surface structure by solder joints.

4. The package of claim 1 wherein said electrical conducting surface structure is located at said first layer at a surface opposite to said second layer.

5. The package of claim 4 wherein said first side of said device is electrically coupled to said electrical conducting surface structure by solder joints between said first layer and said device and by corresponding vias through said first layer.

6. The package of claim 1, wherein said lead is made of a massive metal material.

7. The package of claim 1, wherein said lead is made of a metallized dielectric material.

8. The package of claim 1, wherein said electrical conducting surface is covered by a solder-stop mask.

9. The package of claim 8, wherein said electrical conducting surface is covered by said solder-stop mask only within said recess.

10. The package of claim 1 wherein said lead is coupled to said surface of said second layer.

11. A packaged semiconductor die characterized by being inserted into a multilayer substrate with an upper layer and lower layer, wherein a first die surface structure is electrically connected in a flip-chip configuration to a conducting structure at said lower layer, a second die surface is coplanar to a surface of said substrate and is electrically connected to said substrate by a substantially planar metal leadframe, wherein said substantially planar metal leadframe at least partially overlies said second die surface.

12. A method for packaging a semiconductor device having a first side and a second side, said method comprising the following steps:

providing a printed circuit substrate having a first layer and a second layer, said first layer with an electrical conducting surface structure, said second layer having a recess;

providing a lead for externally connecting said device;

inserting said device into said recess in a flip-chip configuration to electrically couple said first side of said device to said electrical conducting surface structure of said first layer and to arrange said second side of said device coplanar to a surface of said second layer; and electrically coupling said second side of said device to said lead which at least partially overlays said surface of said second layer and at least partially overlays said second side of said device.

\* \* \* \* \*